United States Patent
Yokogawa et al.

(10) Patent No.: US 10,825,657 B2
(45) Date of Patent: Nov. 3, 2020

(54) PLASMA PROCESSING APPARATUS

(71) Applicant: HITACHI HIGH-TECH CORPORATION, Tokyo (JP)

(72) Inventors: Kenetsu Yokogawa, Tokyo (JP); Masakazu Isozaki, Tokyo (JP); Masahito Mori, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 396 days.

(21) Appl. No.: 15/755,338

(22) PCT Filed: Mar. 21, 2017

(86) PCT No.: PCT/JP2017/011093
§ 371 (c)(1),
(2) Date: Feb. 26, 2018

(87) PCT Pub. No.: WO2018/173095
PCT Pub. Date: Sep. 27, 2018

(65) Prior Publication Data
US 2020/0234924 A1    Jul. 23, 2020

(51) Int. Cl.
*H01J 37/32*    (2006.01)
(52) U.S. Cl.
CPC ...... *H01J 37/32174* (2013.01); *H01J 37/321* (2013.01); *H01J 37/32541* (2013.01); *H01J 37/32706* (2013.01); *H01J 37/32715* (2013.01); *H01J 2237/334* (2013.01)
(58) Field of Classification Search
None
See application file for complete search history.

(56) References Cited

U.S. PATENT DOCUMENTS

| | | |
|---|---|---|
| 5,557,215 A | 9/1996 | Saeki et al. |
| 2015/0235809 A1 | 8/2015 | Ito et al. |
| 2016/0203958 A1* | 7/2016 | Arase ............... H01J 37/32935 438/10 |
| 2018/0240697 A1* | 8/2018 | Okita ............... H01J 37/32816 |

FOREIGN PATENT DOCUMENTS

| | | |
|---|---|---|
| JP | 60-005539 A | 1/1985 |
| JP | 03-179735 A | 8/1991 |
| JP | 6-326176 A | 11/1994 |
| JP | 2014-056706 A | 3/2014 |
| JP | 2016-031955 A | 3/2016 |
| JP | 2016-131235 A | 7/2016 |

OTHER PUBLICATIONS

International Search Report from International Patent Application No. PCT/JP2017/011093, dated Jun. 20, 2017.

* cited by examiner

*Primary Examiner* — Dedei K Hammond
(74) *Attorney, Agent, or Firm* — Miles & Stockbridge, P.C.

(57) ABSTRACT

A plasma processing apparatus with improved yield, adapted to include a vacuum container, a processing chamber disposed inside thereof, and in which a plasma is formed, a sample table disposed in the processing chamber and on which a sample is placed, two electrodes which have a film shape, disposed within the sample table, and to which power for attracting the sample is supplied so that different polarities are formed, a coiled portion in which two power supply lines are wound in parallel around the same axis, and a bypass line which connects the two power supply lines between the coiled portion and the two electrodes and has a capacitor.

9 Claims, 4 Drawing Sheets

PLASMA PROCESSING APPARATUS

TECHNICAL FIELD

The present invention relates to a plasma processing apparatus that processes a plate-shaped sample such as a semiconductor wafer disposed in a processing chamber inside a vacuum container by using plasma formed in the processing chamber, and more particularly to a plasma processing apparatus that supplies power to an electrode disposed in a sample table disposed in the processing chamber and processes the sample while electrostatically attracting and holding a sample onto an upper surface of the sample table.

BACKGROUND ART

Plasma processing represented by dry etching for etching the sample such as the semiconductor wafer disposed in a processing chamber inside a processing container such as a vacuum container by using plasma is normally a technique in which a processing gas is introduced into a decompressed processing chamber, an electric field or a magnetic field is supplied into the processing chamber to excite atoms or molecules of the gas to form the plasma, and the sample is processed by using the plasma. In this technique, the plasma formed in the processing chamber is applied to a surface of the sample and a film layer to be processed other than a mask portion of a film structure having a plurality of the film layers including a mask layer formed on the surface of the sample in advance is etched so as to make it possible to obtain a desired shape.

In a plasma processing apparatus including a vacuum container inside which such plasma is generated and a sample is processed, as techniques for forming the plasma, a technique based on an induction electric field, a technique based on an electric field in space between plate-shaped electrodes disposed in parallel (including a technique using a magnetron as an electric field between electrodes), and a technique based on waves of an electric field radiated to predetermined space (including a technique using electron cyclotron resonance by a microwave electric field and magnetic field) are mainly used. At present, it is common to use a high frequency electric field of 13.56 MHz for plasma generation in a system based on inductive coupling.

In the system based on electron cyclotron resonance (ECR), for example, a higher frequency electric field of 2.45 GHz is used. In a plasma processing apparatus for forming the plasma by the inductive coupling and electron cyclotron resonance, normally, apart from plasma generation, a potential for attracting ions to the sample is formed, ions in the plasma are made incident onto the surface of the sample placed and held on the sample table, and the plasma and power for forming the potential are coupled.

Generally, energy generated when ions having electric charges attracted by the potential formed by supply of power collide with the sample surface is utilized to promote etching of a film to be processed which is formed and disposed on the surface of the sample in advance in the direction of the collision. In order to realize an etching process by which a desired shape can be obtained by controlling magnitude of ion energy and an incidence direction of ions, a high frequency power of which frequency (generally, lower frequency) is different from the frequency of power supplied for forming the plasma is supplied to an electrode disposed inside the sample table supporting the sample to face the plasma while magnitude of the electrical power is adjusted.

On the other hand, in the plasma processing apparatus using the plasma by parallel flat plates, conventionally, a high frequency electric field of 13.56 MHz has been used for plasma generation between flat plates, but in recent years, an electric field in a VHF band (for example, 30 MHz to 300 MHz) is used. The reason why the VHF band is used for the frequency of the electric field to be supplied in order to generate such plasma is because discharge is stably formed in the processing chamber so that the plasma can be generated even under the condition that improvement in plasma density and pressure inside the processing chamber are relatively low.

Also, in such a plasma processing apparatus using the parallel flat plates, similarly as in a case of the technique based on induction electric field and the technique based on the ECR or the like using waves of the electric field having higher frequency, apart from the power for generating the plasma, a technique for adjusting energy of ions incident on the surface of the sample from the plasma by adjusting magnitude of the high frequency power to be supplied to an electrode which is disposed inside the sample table, on which the sample is placed, and is a flat plate electrode is also being used.

In order to adjust distribution of bias potential formed between the sample and the plasma and above an upper surface of the sample, as high frequency power to be supplied to the electrode within the sample table, currently, for example, power having a frequency of several hundred kHz to several MHz is used. Also, as the high frequency power used for adjusting energy of such incident ions, power having a frequency in a MHz band higher than a conventional frequency or a frequency band equal to or greater than the MHz band also tends to be used.

In such a plasma processing apparatus, in order to control temperature of the sample to a value within a range suitable for processing during processing, a refrigerant flow path through which a refrigerant circulates and flows inside the sample table is provided in the sample table and the temperature of the sample table is adjusted. Furthermore, fluid having a heat transfer property such as He gas is supplied to a gap between the upper surface of the sample table on which the sample is placed and the sample and electrostatically attracted to promote heat transfer between the sample table (or refrigerant in the refrigerant flow path) and the sample.

In addition to adjusting temperature by the refrigerant, heating the sample using a heater disposed inside the upper portion of the sample table is also performed. As an example of the technique described above, a technique disclosed in JP-A-2014-056706 (PTL 1) has conventionally been known. In PTL 1, a plasma etching apparatus which includes a susceptor which is disposed inside a metallic cylindrical chamber and on which a semiconductor wafer W is mounted, two high frequency power supplies each of which is electrically connected to the susceptor through a matching unit, a shower head which also serves as an upper electrode disposed facing parallel to the susceptor above the susceptor and configures a ceiling of a chamber, and a refrigerant passage, an electrostatic chuck, and a heater that are disposed inside the susceptor is disclosed.

Furthermore, the plasma processing apparatus disclosed in PTL 1 is a cathode coupling type plasma processing apparatus in which a high frequency power having a frequency of 27 MHz or more for forming the plasma and a high frequency power having a low frequency of 13 MHz or less suitable for ion attraction are supplied to the susceptor and capacitively coupled plasma is generated in space of a processing chamber between the upper electrode which is set to the ground potential and a cathode. Furthermore, in this related art, heating wires each of which is a heater disposed in the inner region (central portion) and the outer region (peripheral portion) in the susceptor and a power supply for each heater are connected through a filter for a heater circuit, and the filter for the heater circuit blocks and restrains noise of high frequency power of two frequencies applied to the wafer W and for plasma generation from flowing into a heater feed circuit and thus, accuracy of control of temperature of the wafer W using the heater, plasma generation, and stability and reproducibility of bias potential due to the high frequency power are improved.

CITATION LIST

Patent Literature

PTL 1: JP-A-2014-056706

SUMMARY OF INVENTION

Technical Problem

In the related art described above, problems occur because consideration on the following points is insufficient.

That is, in the related art of adjusting each of plasma generation and incident energy of ions to the sample during processing of the sample by the plasma using power from different high frequency power supplies, impedance magnitude of a cable configuring a power supply path connected to the heater disposed inside the sample table supporting the sample and an electrode for electrostatic chuck of the sample and a circuit on the cable need to have an appropriate value within a range with which matters that high frequency power for forming the plasma and high frequency power for forming bias potential flow into the paths and circuits and adverse influence caused by the matters are restrained and a desired processing result is obtained. For that reason, in general, each element and component which configure the cable configuring the power supply path and the circuit disposed on the power supply path normally have impedance which is determined in advance in designing and is attached and disposed on the power supply path.

However, in a case where the magnitude of the power for bias formation is increased or a high frequency equal to or greater than the VHF band is used for plasma generation, even when slight variations or changes in circuit constants such as an electrostatic capacity and an inductance of the electrodes of the heater and the like and the elements configuring the power supply path and circuit connected to the electrodes are generated, the magnitude of the high frequency power leaked to these paths and circuits fluctuates. Such variations are caused by a length and shape of the cable and a difference in performance and characteristics inherent in each element. For that reason, it has been found that reproducibility of processing such as a generated state of the plasma such as bias potential formed on the surface of the sample or magnitude of density of the plasma above the upper surface of the sample and distribution of the densities, variation in a shape of a sample surface after processing as a result of sample processing is affected.

There was a problem such variations occur between a plurality of apparatuses having the same configuration and a difference between apparatuses increases. Furthermore, in the related art described above, a fact that a function of electrostatic chuck or accuracy of temperature adjustment of the sample due to heating are impaired by a change in the high frequency power flowing into the paths and the circuits and yield of processing is impaired is not taken into consideration.

An object of the invention is to provide a plasma processing apparatus with improved yield in consideration of such a problem.

Solution to Problem

The object described above is achieved by a plasma processing apparatus which includes a processing chamber which is disposed inside a vacuum container and in which the plasma is formed, a sample table which is disposed in the processing chamber and on which a sample to be processed using the plasma is placed, two electrodes which have a film shape, configure an upper surface of the sample table, are disposed within a film, on which the sample is placed and which is made of a dielectric, and to which power for attracting the sample is supplied so that different polarities are formed, a coiled portion in which two power supply lines, which are disposed on a power supply path between the two electrodes and each power supply and connected to each of the two electrodes, are wound in parallel around the same axis, and a bypass line which connects the two power supply lines between the coiled portion and the two electrodes and has a capacitor.

Advantageous Effects of Invention

According to the invention, in particular, it is possible to restrain high frequency power having a high frequency for plasma generation from flowing into a circuit having a bipolar electrostatic chuck electrode or restrain a machine difference thereof, so that it is possible to restrain fluctuation in plasma generation, decrease in reproducibility, and occurrence of differences between apparatuses and it is possible to provide a plasma processing apparatus with improved yield.

DESCRIPTION OF EMBODIMENTS

An embodiment of the invention will be described below with reference to the drawings.

Embodiment 1

The embodiment of the invention will be described with reference to FIGS. 1 to 7.

Figure 1:
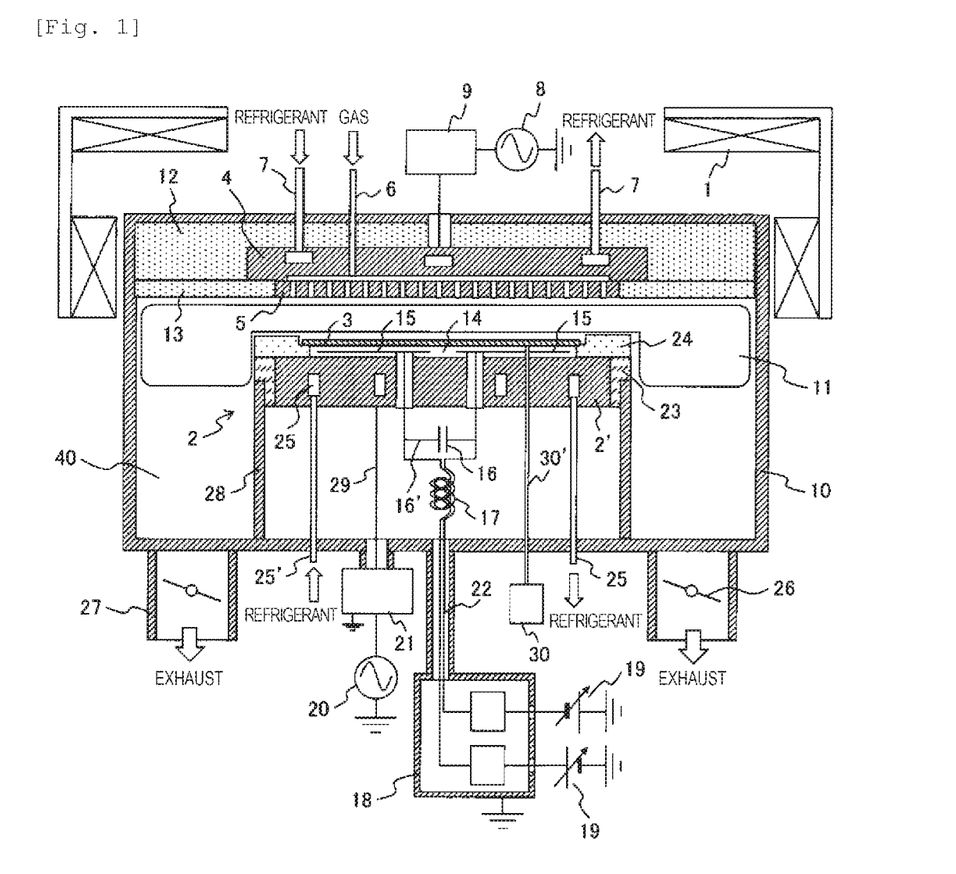
FIG. 1 is a vertical cross-sectional diagram schematically illustrating an outline of a configuration of a plasma processing apparatus according to an embodiment of the invention.

First, an outline of the configuration of the present embodiment will be described with reference to FIG. 1. FIG. 1 is a vertical cross-sectional view schematically illustrating the outline of a configuration of a plasma processing apparatus according to an embodiment of the invention.

A plasma processing apparatus illustrated in FIG. 1 includes a vacuum container 10 of which a side wall is cylindrical, an electromagnetic coil 1 surrounding the outer periphery of the vacuum container 10 and covering the upper surface thereof, and an exhaust port 27 which is a pipe connected to a lower portion of the vacuum container 10 below the vacuum container 10, and a vacuum pump (not illustrated) such as a turbo molecular pump connected to the exhaust port 27 disposed below the vacuum container 10. Furthermore, inside the vacuum container 10, a processing chamber 40, which is a space where a sample 3 to be processed is disposed and the plasma is formed, is disposed.

In the plasma processing apparatus of the present embodiment, in the processing chamber 40, a sample table 2 on which the sample 3 is placed and which supports the sample 3 is disposed. Furthermore, at points which are above the sample table 2 and upper and lower points of space, which is surrounded by cylindrical inner side walls of the vacuum container 10, a disc-shaped upper electrode 4 disposed inside the vacuum container 10 and a metallic lower electrode 2' having a disc shape and disposed inside the sample table 2 are provided so as to face each other.

That is, above the processing chamber 40, which is space having a cylindrical shape, an upper electrode 4 which is disposed to face the sample table 2, on which the substrate-shaped sample 3 such as a semiconductor wafer having a circular shape or a shape equivalent to that is mounted on the upper surface thereof, above the upper surface thereof and which has a disc shape is disposed. Furthermore, on the sample 3 side below a lower surface of the upper electrode 4, a shower plate 5 which covers the lower surface and is disposed with an opened gap is disposed.

A gap disposed between the upper electrode 4 and the shower plate 5 is connected to one end portion of a gas introduction line 6, and the interior of the pipe configuring the gas introduction line 6 and the gap are disposed to communicate with each other. At the other end portion of the pipe of the gas introduction line 6, a gas source (not illustrated) provided with a container in which a gas of which pressure is higher than pressure in the processing chamber 40 is stored and a mass flow controller (MFC) which is disposed on a pipe between the gas source and the other end portion and adjusts a flow rate of the gas flowing from the gas source toward the gaps within the pipe by increasing and decreasing the flow rate are disposed.

With this configuration, the gas which passes through the pipe from a storing portion of the gas source and of which the flow rate is adjusted by MFC is introduced into the gap between the upper electrode 4 and the shower plate 5, and is diffused and filled in the gap. Thereafter, the gas passes through gas introduction holes, which are a plurality of through-holes disposed in the central portion of the shower plate 5 and is introduced into the processing chamber 40 from above the sample table 2 downward.

In the present embodiment, the upper electrode 4 is formed of aluminum or stainless steel or the like which is a conductive material. In an upper electrode temperature control means 7 inside which a passage is disposed and a temperature controller such as a chiller or the like is included, a refrigerant having temperature within a predetermined range is circulated and supplied. As a result, the temperature of the upper electrode 4 is adjusted so as to be a value within a range suitable for processing of the sample 3 during the processing.

The shower plate 5 of the present embodiment is a member having a disc shape and made of a dielectric material such as quartz or silicon. The shower plate 5 configures the central portion of a ceiling surface of the processing chamber 40 and faces the upper surface of the sample table 2 having a cylindrical shape in the lower portion of the processing chamber 40 or the sample 3 having a disc shape and placed on the sample table 2 and is disposed at a position at which a center axis thereof coincides with a center axis of the sample table 2, the sample surface of the sample 3, or the processing chamber 40 in the vertical direction or at an equivalent position approximating to such a degree that the center axis of the shower plate 5 is regarded as being coincided therewith. Furthermore, between the outer peripheral side of the shower plate 5 and the inner peripheral wall surface of the vacuum container 10, an insulating ring 13, which surrounds the outer periphery of the shower plate 5 and made of a dielectric material such as quartz and which is a ring-shaped member for insulating the upper electrode 4 or the shower plate 5 from the vacuum container 10, is disposed.

The upper electrode 4 and the lower electrode 2' of the present embodiment are electrically connected to high frequency power supplies which are disposed outside the vacuum container 10 and output power of different frequencies, respectively. In the present embodiment, during processing of the sample 3, high frequency power output from each high frequency power supply is supplied to the upper electrode 4 and the lower electrode 2' and a magnetic field is generated by the electromagnetic coil 1, and the inside of the processing chamber 40 is supplied with the electric field and the magnetic field in parallel.

That is, the upper electrode 4 is electrically connected to a discharge high frequency power supply 8 through a power supply path such as a coaxial cable, and high frequency power of a predetermined frequency is supplied thereto through a discharge high frequency power matcher 9. In the present embodiment, power having a frequency within the high frequency band of 200 MHz is used as the discharge high frequency power. In addition, a portion above and the periphery of the upper electrode 4 disposed in the upper portion configuring a lid of the vacuum container 10 are surrounded by and built in an upper electrode insulator 12 formed of quartz, Teflon (registered trademark), space, and the like, and the upper electrode 4 is electrically insulated from the vacuum container 10.

The lower electrode 2' inside the sample table 2 is electrically connected to a bias high frequency power supply 20 that outputs high frequency power of a predetermined frequency (4 MHz in the present embodiment) for forming a bias potential above the upper surface of the sample 3 placed on the sample table 2 through a power supply path 29 such as a coaxial cable or the like. During processing of the sample 3, high frequency power of 4 MHz for bias is supplied from the bias high frequency power supply 20 to the lower electrode 2' through a bias high frequency power matcher 21.

In a state in which the sample 3 is placed on the upper surface of the sample table 2 and held and the processing chamber 40 is sealed against the outside of the side wall of the vacuum container 10, gas is introduced into cylindrical space between the upper electrode 4 and the lower electrode 2' of the processing chamber 40 from gas introduction holes of the shower plate 5 while the supplied flow rate or speed is adjusted by the MFC and particles such as atoms and molecules of gas within the processing chamber 40 are exhausted from an exhaust port 27 communicating with an exhaust opening disposed on the bottom surface of the processing chamber 40 below the sample table 2 while the flow rate or speed of the exhaust gas is adjusted by an exhaust adjusting valve 26 which is disposed within the exhaust port 27 and which increases and decreases a cross-sectional area of a flow passage by rotating a plate-shaped flap about an axis crossing the flow passage. In this state, operations of the MFC and the exhaust adjusting valve 26 are adjusted based on a command signal from a control device (not shown), and due to balance of the flow rate or speed of supply and exhaust of gas to the processing chamber 40, pressure inside the processing chamber 40 is set to a value within a range suitable for discharge and maintenance of a plasma 11 or processing of the sample 3.

In this state, the electric field formed by the high frequency power of which the output is adjusted to be supplied so that discharge can occur by dissociating or ionizing the gas atoms or molecules and the magnetic field by the electromagnetic coil 1 are supplied, the ECR due to the electric field and the magnetic field occurs, and the plasma 11 is formed in the processing chamber 40. As such, the plasma processing apparatus of the present embodiment is a parallel flat plate type plasma processing apparatus (having a magnetic field) that supplies a magnetic field together with an electric field.

Next, a configuration of the sample table 2 will be described. An electrostatic chuck film 14 made of a dielectric material which is made of a ceramic material such as alumina or yttria is disposed on a circular upper surface of the lower electrode 2' which is a base material of the sample table 2 of the present embodiment. Inside the electrostatic chuck film 14, a plurality of film-shaped tungsten electrodes 15 each of which is electrically connected to a DC power supply 19 are disposed and built in. The reference numeral 23 denotes an insulator, the reference numeral 24 denotes a susceptor, and the reference numeral 28 denotes a holding mechanism of sample setting means.

Inside the lower electrode 2' of the sample table 2, multiple refrigerant passages 25 disposed in a circular arc shape or spirally around the center axis in the vertical direction thereof are disposed. The refrigerant passages 25 are connected to a refrigerant introduction mechanism for temperature control which includes a temperature controller such as a chiller disposed on a stair below the floor of a building in which the plasma processing apparatus of the present embodiment is disposed, by sandwiching a pipe 25' connected to each of outlets and inlets of the refrigerant passages 25 of the sample table 2 therebetween. During the processing of the sample 3, the refrigerant adjusted to a temperature within a range determined in advance and supplied to the pipe 25' in the refrigerant introduction mechanism for temperature control flows into the sample table 2, is supplied to the refrigerant passage 25, is subjected to heat exchange, passes through the pipe 25' connected to the outlet of the sample table 2, returns to the refrigerant introduction mechanism for temperature control, and circulates again, so that temperature of the lower electrode 2' or the sample table 2 is set within an allowable range suitable for processing.

In addition, on the upper surface of the electrostatic chuck film 14, at least one opening and a heat transfer gas supply path 30' which is a pipe line communicating therewith and penetrating the electrostatic chuck film 14 and into which heat transfer gas is supplied is disposed. The upper end portion of the heat transfer gas supply path 30' communicates with a heat transfer gas supply hole which is an opening and the lower end portion thereof communicates with a helium introduction mechanism 30 which includes a container inside which the heat transfer gas such as helium which is in high pressure is stored, and an adjusting valve (not illustrated) for adjusting a flow rate or pressure of the heat transfer gas is disposed outside the sample table 2 in the middle of the heat transfer gas supply path 30'. With this configuration, a transfer gas of which pressure is adjusted by the adjusting valve and which increases a heat transfer amount between the sample table 2 and the sample 3 is supplied between the upper surface of the electrostatic chuck film 14 of the sample table 2 and the back surface of the sample 3 placed above the sample table 2 from the helium introduction mechanism 30, and efficiency of heat transfer is increased and responsiveness and accuracy of temperature control of the sample 3 are improved.

The DC power supply 19 for supplying DC power to the tungsten electrode 15 is connected to the tungsten electrode 15. At least a capacitor 16, an air-core inductor 17, and furthermore, a low-pass filter 18 are connected on a power supply line 22, which connects the tungsten electrode 15 and the DC power supply 19, in order from the tungsten electrode 15 below the sample table 2.

In the present embodiment, on a plurality of tungsten electrodes 15 disposed inside the electrostatic chuck film 14, different polarities are formed by DC power from the DC power supply 19 to which each tungsten electrode 15 is connected in a state where the sample 3 is placed above the upper surface of the electrostatic chuck film 14, and an electrostatic force for attracting the sample 3 on the electrostatic chuck film 14 is formed by the polarities and the tungsten electrodes 15 are electrodes (bipolar electrodes) have a so-called bipolar property. In a planar shape of the plurality of tungsten electrodes 15 illustrated in the present embodiment when viewed from above the sample table 2 or a shape projected onto the upper surface of the electrostatic chuck film 14 having a planar form thereof are different from each other, portions to which the different polarities, that is, positive and negative potentials are applied are formed to have the same or an approximate area to be regarded as the same area.

The point between the air-core inductor 17 and the tungsten electrode 15 of the power supply line 22 of each tungsten electrode 15 is connected by a bypass line 16' having the capacitor 16 thereon. The bypass line 16' including the capacitor 16 thereon has a role of restraining AC potential difference between the electrodes by alternately short-circuiting the power supply lines 22 that respectively connect each tungsten electrodes 15 having the different polarity and each DC power supply 19. In the power supply line 22 of the present embodiment, a ground electrode or a point which is set to a ground potential is not provided between a connection portion between the bypass line 16' and each of the two power supply lines 22 and the two tungsten electrodes 15 and the air-core inductor 17.

In the present embodiment, the capacitor 16 having a capacitance of 1000 pF is used. The capacitor 16 is disposed to achieve effect capable of restraining a potential difference between the tungsten electrodes 15 that the potentials of different polarities are formed on the surfaces thereof, in particular, for high frequency power (200 MHz in the present embodiment) for plasma generation.

The low-pass filter 18 is disposed to restrain or block high frequency power of frequencies (4 MHz in the present embodiment), which is supplied from the bias high frequency power supply 20 to the lower electrode 2', from passing through the power supply line 22 connected to the tungsten electrode 15. The low-pass filter 18 having the characteristics of passing through the direct current is disposed so as to make it possible to restrain high frequency power for forming the bias from flowing into the DC power supply 19.

Each of two air-core inductors 17 disposed on the power supply line 22 which is connected to two of the plurality of tungsten electrodes 15 to be set to positive and negative potentials and supplies a DC voltage is composed of a film made of a material having an insulating property and coiled conductor material which is covered with the film and is insulated from each other in a direct current manner, and each coiled line is formed by winding an axis in the same direction around the axis in common. In the present embodiment, the size of the air-core inductors 17 illustrated in FIG. 1 is formed such that the diameter of the coil-shaped portion is 40 mm, the number of turns is 5, and the length is 70 mm, and magnitude of each inductance is set to 0.7 to 0.9 µH.

The air-core inductors 17 are disposed for the purpose of preventing the high frequency power for plasma generation from flowing into the power supply line 22 through the tungsten electrode 15 within the electrostatic chuck film 14. In a state where the plasma 11 is formed within the processing chamber 40, the high frequency power for plasma generation flows from the upper electrode 4 into the tungsten electrode 15 built in the electrostatic chuck film 14 of the sample table 2 through the plasma 11.

High frequency power flowing into the tungsten electrode 15 flows into the power supply line 22 connected thereto. When a flown amount thereof is large, magnitude of intensity or density of the plasma 11 formed within the processing chamber 40 above the sample table 2 or magnitude of variation of distribution in the radial direction or the circumferential direction on the upper surface of the sample 3 becomes large due to a stray capacitance on the power supply line 22 and variation in the characteristics of the low-pass filter 18 disposed at a subsequent stage thereof.

For that reason, it is necessary to restrain the amount of high frequency power for plasma formation flowing into the power supply line 22 to be small. For this, it is necessary to sufficiently increase impedance with respect to the high frequency power of 200 MHz for plasma generation at the DC power supply 19 side when viewed from the tungsten electrode 15.

The air-core inductor 17 of the present embodiment is disposed at a position near the tungsten electrode 15 connected to the power supply line 22 below the lower surface of the lower electrode 2' of the sample table 2 so as to make it possible to increase impedance of the power supply line 22 with respect to the high frequency for plasma generation while restraining influence by stray impedance of the power supply line 22 to a small extent.

That is, in the present embodiment, 200 MHz is used as the frequency of the high frequency power for plasma generation and the air-core inductor 17 is set to 0.7 to 0.9 µH, so that impedance of the power supply line 22 with respect to the high frequency power for plasma generation when viewed from the tungsten electrode 15 is set to approximately 1000Ω. With this air-core inductor 17, the high frequency power for plasma generation is restrained from flowing through the power supply line 22, so that it is possible to prevent changes and variations in a generation state, intensity and distribution of the plasma in the processing chamber 40 above the electrostatic chuck film 14 caused by the stray capacitance of the power supply line 22 and variations in characteristics of the low-pass filter 18 at the subsequent stage.

Next, a combination of the capacitor 16 and the air-core inductor 17 will be described. As described above, the capacitor 16 is disposed on a line which connects a plurality of the bipolar tungsten electrodes 15 (two in FIG. 1) for electrostatic chuck and the DC power supplies 19 configured to be capable of supplying variable power for each tungsten electrode 15 and connecting the bypass lines 16' through which the current flows inside thereof at a position closer to the tungsten electrode 15 than the air-core inductor 17. By the bypass line 16' provided with the capacitor 16 thereon, the power supply lines 22 are short-circuited (in an AC manner) to the AC current flowing through the line.

Figure 2:
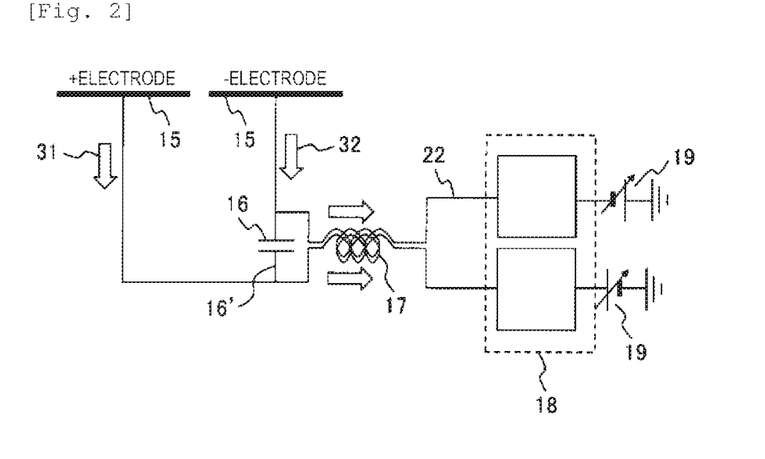
FIG. 2 is a diagram schematically illustrating a configuration of an electrostatic chuck electrode, a DC power supply, a power supply line between the electrostatic chuck electrode and the DC power supply, and a current flowing on the power supply line in the plasma processing apparatus illustrated in FIG. 1.
Figure 4:
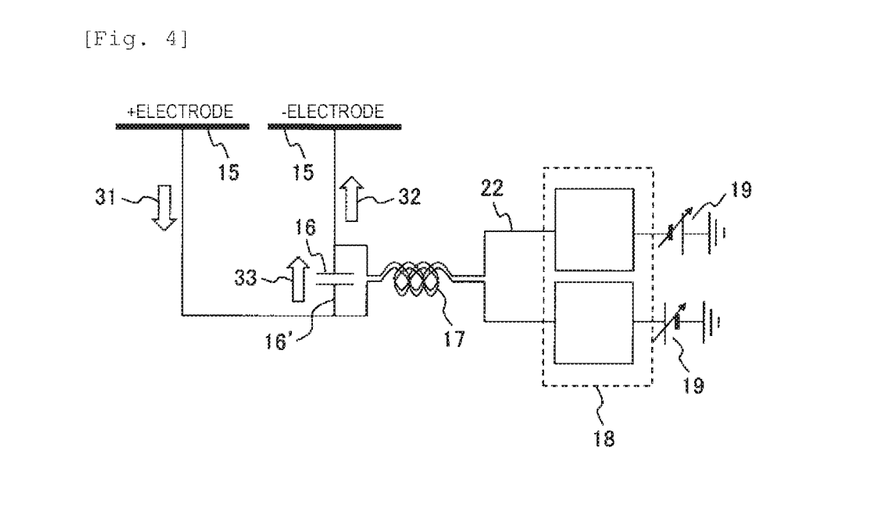
FIG. 4 is another diagram schematically illustrating the configuration of the electrostatic chuck electrode, the DC power supply, the power supply line between the electrostatic chuck electrode and the DC power supply, and the current flowing on the power supply line in the plasma processing apparatus illustrated in FIG. 1.
Figure 6:
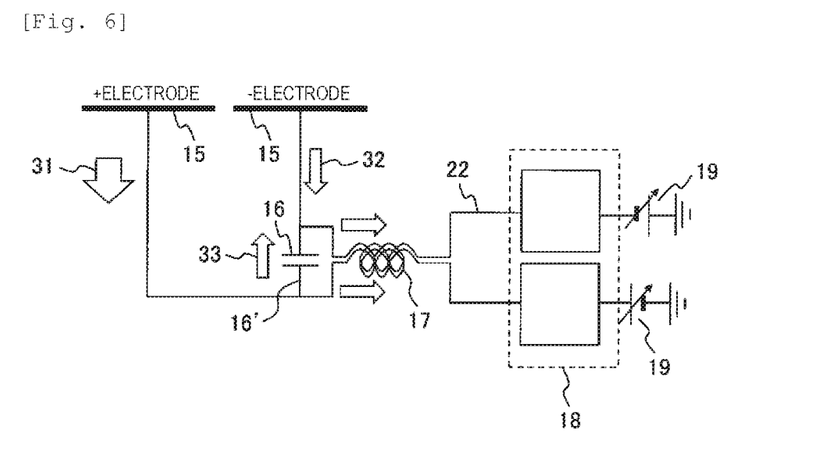
FIG. 6 is still another diagram schematically illustrating the configuration of the electrostatic chuck electrode, the DC power supply, the power supply line between the electrostatic chuck electrode and the DC power supply, and the current flowing on the power supply line in the plasma processing apparatus illustrated in FIG. 1.

FIGS. 2, 4, and 6 are diagrams schematically illustrating the configurations of the electrostatic chuck electrode, the DC power supply, the power supply line therebetween, and currents flowing thereon in the plasma processing apparatus according to the embodiment illustrated in FIG. 1. In FIG. 2, in the present embodiment, a case where currents (high frequency currents) 31 and 32 of high frequency power in the same direction and having the same amount flow into the electrodes having positive and negative polarities of the tungsten electrodes 15 which are bipolar electrostatic chuck electrodes, respectively, is illustrated. The reference numeral 31 denotes a high frequency current flowing through the tungsten electrode 15 which is set to a positive potential and a power supply line connected to the electrode 15 and reference numeral 32 denotes a high frequency current flowing through the tungsten electrode 15 which is set to a negative potential and a power supply line connected to the tungsten electrode 15.

In this figure, when each air-core inductor 17 operates in the same way and the high frequency power flows through the inside of the line of the coiled portion, the air-core inductors 17 develops impedance and generates an electromotive force so as to block the high frequency power current from flowing and exerts an action to restrain the high frequency power current from flowing toward the DC power supply 19. Furthermore, as in the present embodiment, the two air-core inductors 17 on the power supply line 22 connected to the two tungsten electrodes 15 having positive and negative polarities have a configuration in which a winding axis of the line of the coiled portion is made common (commonly wound). With this configuration, as a result of high frequency currents having the same magnitude or equivalent magnitude flowing in the two coiled portions wound in common, an inductance of which characteristics are aligned occurs in the coiled portions of the two air-core inductors 17 and variation in the amount of the high frequency current flowing into the DC power supply 19 for each line is reduced.

Figure 3:
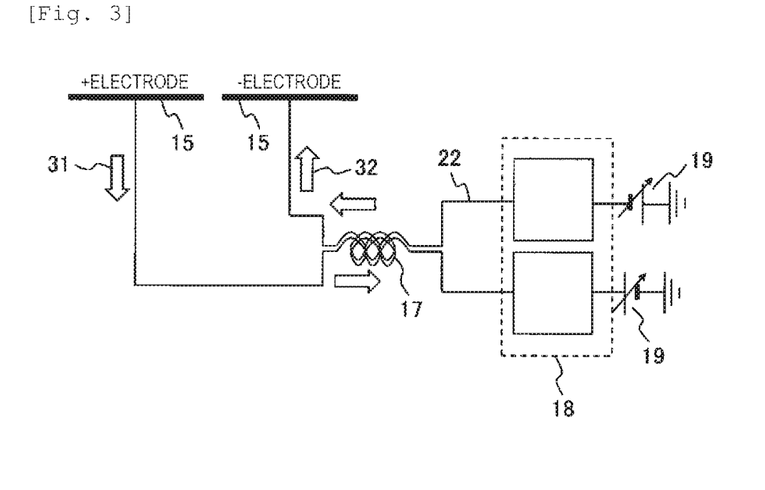
FIG. 3 is a diagram schematically illustrating a configuration of an electrostatic chuck electrode, a DC power supply, a power supply line between the electrostatic chuck electrode and the DC power supply, and a current flowing on the power supply line according to a comparative example of the present embodiment.

On the other hand, FIG. 3 is a diagram schematically illustrating the configuration of the electrostatic chuck electrode, the DC power supply, the power supply line therebetween, and the current flowing thereon according to a comparative example of the present embodiment. In the present comparative example, unlike the configuration illustrated in FIG. 2, the capacitor 16 is not disposed on the line that connects the power supply lines 22 connected to the two tungsten electrodes 15 in an AC manner.

For example, in a case where the high frequency power for plasma generation is an electric field in a ultrahigh frequency band of VHF band (30 to 300 MHz in the present embodiment) or more, as a result of phases of the high frequency flowing into the positive electrode and the negative electrode that are being different from each other due to standing wave distribution in the plasma, the directions of the high frequency currents 31 and 32 flowing through the two power supply lines 22 may be different from each other. In the example illustrated in FIG. 3, a state in which the high frequency current 31 flowing through the tungsten electrode 15 which is set to a positive potential and the power supply line 22 connected to the tungsten electrode 15 is directed toward the DC power supply 19 and the high frequency current 32 flowing through the tungsten electrode 15 which is set to a negative potential and the power supply line 22 connected thereto flows toward the tungsten electrode 15 is illustrated.

In the configuration of the comparative example illustrated in FIG. 3, the capacitor 16 connects the power supply lines 22 between the air-core inductor 17 and the tungsten electrode 15 to each other, so to speak, the capacitor 16 is not disposed in an AC manner at a front stage of the air-core inductor 17. In this case, when the high frequency currents 31 and 32 flow in opposite directions to the respective power supply lines 22 illustrated in FIG. 3, the electromotive forces caused by inductances occurring in the coiled portions of the two commonly wound air-core inductors 17 connected to the power supply lines 22 cancel each other out. For that reason, even when the air-core inductor 17 is provided, the effect of reducing variation in the high frequency current due to the inductance of which characteristics are aligned as illustrated in FIG. 2 is impaired and responsiveness of the effect of high impedance in the embodiment of FIG. 2 is hindered.

Furthermore, FIG. 4 is a diagram schematically illustrating the configuration of the electrostatic chuck electrode, the DC power supply and the power supply line therebetween, and the current flowing thereon in the plasma processing apparatus according to the embodiment illustrated in FIG. 1. In FIG. 4, similarly to FIG. 3, a state in which the high frequency current 31 flowing through the tungsten electrode 15 which is set to a positive potential and the power supply line 22 connected to the tungsten electrode 15 is directed toward the DC power supply 19 and the high frequency current 32 flowing through the tungsten electrode 15 which is set to a negative potential and the power supply line 22 connected thereto flows toward the tungsten electrode 15 is illustrated.

In FIG. 4, the high frequency current 31 passes through the bypass line 16' connected to the power supply line 22 between the tungsten electrode 15 which is set to the positive potential and the air-core inductor 17 as a bypass current 33 through the capacitor 16 and flows into the power supply line 22 connected to the tungsten electrode 15 which is set to the negative potential through the power supply line 22. For that reason, the high frequency current 31 is bypassed by connecting the capacitor 16 and the bypass line 16' and thus, the high frequency current 31 having a different phase is restrained from flowing into the coiled portion of the other air-core inductors 17 in a state where the high frequency current 32 is flowing in the coiled portion of one air-core inductor 17. With this, the high frequency currents having different phases flow to the coiled portion of the common winding, so that the effect of the inductance is restrained from being canceled or damaged.

On the other hand, even in a case where the directions of the high frequency currents flowing into the tungsten electrodes 15 which are respectively set to the positive and negative potentials are same and for example, differences in amplitude (potential difference) exist, in the configuration of this embodiment, it is possible to achieve the same effect as that of the matters described above.

Figure 5:
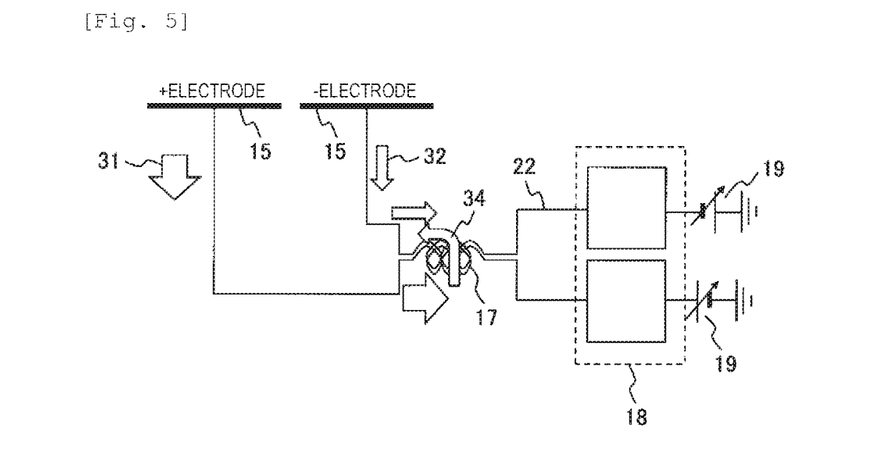
FIG. 5 is another diagram schematically illustrating the configuration of the electrostatic chuck electrode, the DC power supply, the power supply line between the electrostatic chuck electrode and the DC power supply, and the current flowing on the power supply line according to the comparative example of the present embodiment.

FIG. 5 is a diagram schematically illustrating the configuration of the electrostatic chuck electrode, the DC power supply, and the power supply line therebetween, and the current flowing thereon according to the comparative example of the present embodiment. In FIG. 5, similarly to FIG. 3, a case where the capacitor 16 and the bypass line 16' do not connect the two power supply lines 22 and there is a potential difference with which the phases are the same but amplitudes are different in the high frequency power flowing through the tungsten electrodes 15 which are respectively set to the positive and negative potentials and the power supply lines 22 connected to the tungsten electrodes 15. The flowing directions of the high frequency currents 31 and 32 flowing through the power supply line between each tungsten electrode 15 and the air-core inductor are the same as in FIG. 2, and the amplitude of the high frequency current 31 is made larger than that of the high frequency current 32.

In the case of FIG. 5, an opposite directional current 34 is generated by the high frequency current 31, which flows through the air-core inductor 17 and has large amplitude, through an inter-line capacitance. By the opposite directional current 34, effect of the air-core inductor 17 through which the high frequency current 32 having small amplitude flows is restrained and impedance at the air-core inductor 17 is lowered, such that the flowing amount of the high frequency current 31 or the high frequency current 32 is increased.

On the other hand, as illustrated in FIG. 6, in the present embodiment, the bypass line 16' having the capacitor 16 is disposed so as to be connected between the two power supply lines 22 at the front stage of the air-core inductor 17 and a portion of the high frequency current 31 having large amplitude is divided by the bypass line 16' as the bypass current 33 and flows through the circuit, and furthermore, joins with the high frequency current 32 from a connection portion between the power supply line 22 and the bypass line 16' connected to the tungsten electrode 15 which is set to a negative potential, and flows toward the air-core inductor 17, the low-pass filter 18 and the DC power supply 19. For that reason, the potential difference between the two power supply lines 22 is reduced by an amount corresponding to the capacitor 16 of the bypass line 16'.

With this, the amount of the high frequency current flowing into the air-core inductor 17 is made small in the difference therebetween and is made close to an equivalent amount. For this reason, the function and effect that the inductance of which characteristics of the air-core inductor 17 are aligned is generated in the coiled portions of the two air-core inductors 17 and variation in the amount of the high frequency currents which flow through the coiled portions to flow into the DC power supply 19 for each line is reduced are achieved even when there is a difference in amplitude of the current of the high frequency power flowing through the two power supply lines 22 or there is a potential difference of the high frequency power.

As described above, even when the phase and amplitude of the high frequency current flowing into the positive and negative tungsten electrodes 15 are different from each other, the air-core inductor 17 is restrained from being impaired by disposing the capacitor 16 at the front stage of the air-core inductor 17. With this, variations in magnitude of the density and intensity of the plasma 11 and distribution of the plasma 11 formed above the upper surface of the electrostatic chuck film 14 of the sample table 2 due to fluctuation in the amount of high frequency power for plasma formation flowing into the electrode for electrostatic chuck are restrained from fluctuating and yield of processing of the sample is restrained from being impaired.

In the embodiment described above, two air-core inductors 17 provided with coiled portions of which each line is wound around a common axis (commonly wound) are disposed on the power supply lines 22 connected to the tungsten electrodes 15 which are set to the positive and negative potentials of a plurality of tungsten electrodes 15 (two in FIGS. 2, 4, and 6) which are bipolar electrodes for electrostatic chuck, respectively. The inductance of the coiled portion through which the high frequency current flows can be increased by using a member made of a material having magnetic permeability such as ferrite which is higher than that of vacuum space or atmosphere within the inner core portion thereof. On the other hand, when power of which the frequency is in the VHF band or higher frequency band is used as high frequency power for plasma generation, the member made of the material having such high magnetic permeability acts as a resistor and loss of high frequency power increases and as a result, there is a concern that higher impedance and effect by the higher impedance are impaired.

For that reason, in the present embodiment, the air-core inductor 17 is provided as an element disposed on the power supply path connected to the electrode for electrostatic chuck. Further, in order to stabilize characteristics of the air-core inductor 17 and restrain individual differences, a material such as resin having small loss such as polytetrafluoroethylene (PTFE) may be used as a core inside the coiled line or a fixing jig of the line.

Figure 7:
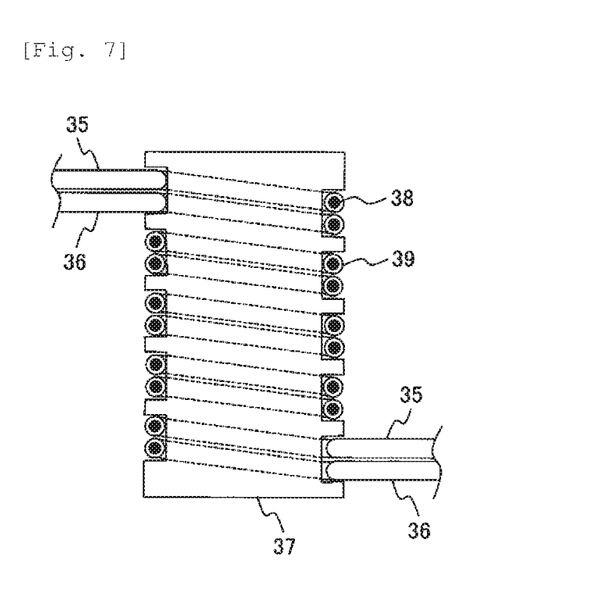
FIG. 7 is an explanatory diagram of a structure of an air-core inductor in the plasma processing apparatus according to the embodiment of the invention.

FIG. 7 is a vertical cross-sectional view schematically illustrating an outline of the configuration of the air-core inductor of the embodiment illustrated in FIG. 1. In the present embodiment, as illustrated in FIG. 7, the air-core inductor 17 is configured in such a way that a portion of a power supply line (positive electrode side line) 35 connected to the tungsten electrode 15 which is set to the positive potential and a portion of a power supply line (negative electrode side line) 36 connected to the tungsten electrode 15 which is set to the negative potential among the plurality of power supply lines 22 are wound along a cylindrical surface from one of the upper and lower sides toward the other of the upper and lower sides around the vertical axis of fixing jigs 37, which have a cylindrical shape and are disposed adjacent to each other as a pair of the power supply lines 35 and 36. The current of high frequency power for plasma formation flows through the two power supply lines 35 and 36 of the coiled portion having such a configuration in parallel around the fixing jig 37 which is a common core member through the tungsten electrode 15 such that an inductance of which characteristics are aligned is formed and variation in the amount of high frequency current for each line is reduced.

The power supply lines 35 and 36 are inserted inside a spiral groove, which extends in the vertical direction around the vertical axis on the cylindrical surface of the fixing jig 37 having a cylindrical shape and made of PTFE as a material, and are around the fixing jig 37 along the groove. Further, in the present example, the power supply line 35 and the power supply line 36 are covered with an insulation coating film 39 in which a surface of a copper core wire 38 is made of a material such as resin having an insulation property.

It is preferable that the capacitor 16 and the air-core inductor 17 are disposed as close as possible from the tungsten electrode 15. When a length of the power supply line 22 between points of the capacitor 16 and the air-core inductor 17 and the tungsten electrode 15 becomes greater than or equal to a wavelength of a high frequency current, there is a concern that the stray impedance of the power supply line 22 influences the characteristics of the high frequency current flowing to increase fluctuation and density and intensity of the plasma 11 formed in the processing chamber 40 above the sample table 2 and variation in distribution thereof is increased and reproducibility of processing is impaired. Accordingly, the frequency of the high frequency power for plasma generation is 200 MHz and thus, the length of the power supply line 22 from the tungsten electrode 15 to the capacitor 16 and the air-core inductor 17 is set to be equal to or less than the wavelength (1.5 m) of the current of the high frequency power, and particularly to 0.3 m.

The air-core inductor 17 has a self-resonance characteristic associated with stray impedance or stray capacitance of the coiled portion and has impedance characteristics that can be expressed by a parallel circuit of the normal inductance and a capacitance. When the frequency of the high frequency power flowing through the power supply line 22 or the power supply lines 35 and 36 is equal to or close to the self-resonance frequency, parallel resonance occurs and impedance occurs in the air-core inductor 17.

However, impedance due to such resonance is largely influenced by a structure of the element including the coiled portion and the frequency of the high frequency power flowing, and abruptly changes with respect to slight fluctuation in the structure and the frequency. For that reason, in the present embodiment, it is preferable that the self-resonant frequency of the air-core inductor 17 is 1.1 times or more or 0.9 times or less the frequency of the high frequency power for plasma generation. For example, in the present embodiment, the frequency of the high frequency power is 200 MHz and thus, a configuration in which the self-resonance frequency of the air-core inductor 17 is set to be in the vicinity of 240 MHz is preferably adopted.

As described above, according to the present embodiment, it is possible to provide a plasma processing apparatus which is capable of restraining the high frequency power for plasma generation having a high frequency from flowing into the circuit of the bipolar electrostatic chuck electrode or the machine difference thereof and restraining fluctuation of plasma generation, deterioration of reproducibility, and occurrence of difference between apparatuses, and in which yield is improved.

The invention is not limited to the embodiment described above, but includes various modification examples. For example, the embodiment described above has been described in detail in order to describe the invention in an easy-to-understand manner, and is not necessarily limited to that having all the configurations described. Further, it is possible to add, delete, and replace other configurations with respect to a portion of a certain configuration.

INDUSTRIAL APPLICABILITY

The invention relates to an apparatus for manufacturing a semiconductor device, and more particularly to a plasma etching apparatus for performing an etching process of a semiconductor material using a pattern rendered by a lithography technique as a mask. According to the invention, in the case of generating the plasma at a high frequency equal to or higher than the VHF band, which is dominant in plasma generation characteristics at wide range pressure, a filter that prevents the high frequency for plasma generation from flowing into the electrostatic chuck function portion provided in the sample setting means is realized. Due to the effect of the invention, it is possible to greatly restrain reduction in process reproducibility and occurrence of the difference between apparatuses in the plasma processing apparatus using a high frequency in the VHF band or higher for plasma generation.

REFERENCE SIGNS LIST

1: electromagnetic coil
2: sample table
2': lower electrode
3: sample
4: upper electrode
5: shower plate
6: gas introduction line
7: upper electrode temperature control means
8: discharge high frequency power supply
9: discharge high frequency power matcher
10: vacuum container
11: plasma
12: upper electrode insulator
13: insulating ring
14: electrostatic chuck film
15: tungsten electrode
16: capacitor
16': bypass line
17: air-core inductor
18: low-pass filter
19: DC power supply
20: bias high frequency power supply
21: bias high frequency power matcher
22: power supply line
23: insulator
24: susceptor
25: refrigerant passage
25': pipe
26: exhaust adjusting valve
27: exhaust port
28: holding mechanism of sample setting means
29: power supply path
30: helium introduction mechanism
30': heat transfer gas supply path
31, 32: high frequency current
33: bypass current
34: opposite directional current
35: power supply line (positive electrode side line)
36: power supply line (negative electrode side line)
37: air-core inductor fixing jig made of PTFE
38: copper core wire
39: insulation coating film
40: processing chamber

The invention claimed is:

1. A plasma processing apparatus comprising:
a processing chamber which is disposed inside a vacuum container and in which a plasma is formed;
a sample table which is disposed in the processing chamber and on which a sample to be processed using the plasma is placed;
two electrodes which have a film shape, configure an upper surface of the sample table, are disposed within a film, on which the sample is placed and which is made of a dielectric, and to which power for attracting the sample is supplied so that different polarities are formed;
a coiled portion in which two power supply lines, which are disposed on a power supply path between the two electrodes and each power supply and connected to each of the two electrodes, are wound in parallel around the same axis; and
a bypass line which connects the two power supply lines between the coiled portion and the two electrodes and has a capacitor.

2. The plasma processing apparatus according to claim 1, further comprising:
a high frequency power supply that supplies high frequency power for forming an electric field for forming the plasma in the processing chamber,
wherein a frequency of the high frequency power is in a range of 30 to 300 MHz.

3. The plasma processing apparatus according to claim 2, wherein the coiled portion is on the two power supply lines and a distance from the two electrodes of the line power supply lines is within one wavelength of the high frequency power.

4. The plasma processing apparatus according to claim 3, further comprising:
a filter that is disposed between the coiled portion on the two power supply lines and each of the power supplies and filters the high frequency power.

5. The plasma processing apparatus according to claim 2, further comprising:
a filter that is disposed between the coiled portion on the two power supply lines and each of the power supplies and filters the high frequency power.

6. The plasma processing apparatus according to claim 2, wherein the coiled portion does not have a core inside thereof.

7. The plasma processing apparatus according to claim 6, further comprising:
a filter that is disposed between the coiled portion on the two power supply lines and each of the power supplies and filters the high frequency power.

8. The plasma processing apparatus according to claim 1, wherein the coiled portion does not have a core inside thereof.

9. The plasma processing apparatus according to claim 8, wherein the coiled portion is on the two power supply lines and a distance from the two electrodes of the line power supply lines is within one wavelength of the high frequency power.

* * * * *